(12) United States Patent
Huang (10) Patent No.: US 10,713,465 B2
(45) Date of Patent: Jul. 14, 2020

(54) IMAGE CAPTURE APPARATUS

(71) Applicant: GINGY TECHNOLOGY INC., Hsinchu (TW)

(72) Inventor: Cheng-Jyun Huang, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 110 days.

(21) Appl. No.: 15/956,875

(22) Filed: Apr. 19, 2018

(65) Prior Publication Data

US 2018/0293423 A1 Oct. 11, 2018

Related U.S. Application Data

(63) Continuation-in-part of application No. 15/719,575, filed on Sep. 29, 2017, and a continuation-in-part of (Continued)

(30) Foreign Application Priority Data

Nov. 4, 2016 (TW) .............................. 105135846 A
Mar. 17, 2017 (CN) ...................... 2017 2 0260844 U
(Continued)

(51) Int. Cl.
*F21V 8/00* (2006.01)
*G02B 6/12* (2006.01)
(Continued)

(52) U.S. Cl.
CPC ......... *G06K 9/0004* (2013.01); *G02B 6/0031* (2013.01); *G02B 27/0977* (2013.01); (Continued)

(58) Field of Classification Search
CPC .. G06K 9/00; G06K 9/00006; G06K 9/00013; G06K 9/00026; G06K 9/00046;
(Continued)

(56) References Cited

U.S. PATENT DOCUMENTS

| 7,274,808 B2 * | 9/2007 | Baharav ................ G06F 3/0421 382/124 |
| 2016/0117543 A1 | 4/2016 | Huang et al. |

FOREIGN PATENT DOCUMENTS

| TW | 200825943 | 6/2008 |
| TW | 201419165 A | 5/2014 |

\* cited by examiner

*Primary Examiner* — John Bedtelyon
(74) *Attorney, Agent, or Firm* — JCIPRNET (57) ABSTRACT

An image capture apparatus including a light guide element, an image capture device and a light emitting device. The light guide element has a first side, a second side and a light emitting portion located at the second side. The light emitting portion includes a plurality of enhanced transmission microstructures. The image capture device is disposed on the second side of the light guide element corresponding to the position of the enhanced transmission microstructures. A light beam, which is generated by the light emitting device and transmitted at least by the light guide element, is totally reflected to form a signal light beam. Thereafter, the signal light beam passes through the enhanced transmission microstructures and then is received by the image capture device.

19 Claims, 9 Drawing Sheets

Related U.S. Application Data application No. 15/588,700, filed on May 8, 2017, now Pat. No. 10,455,129, and a continuation-in-part of application No. 15/399,704, filed on Jan. 5, 2017, now Pat. No. 10,356,296.

(60) Provisional application No. 62/574,222, filed on Oct. 19, 2017, provisional application No. 62/413,974, filed on Oct. 27, 2016, provisional application No. 62/371,230, filed on Aug. 5, 2016.

(30) Foreign Application Priority Data

Jun. 29, 2017 (TW) .............................. 106121692 A
Jul. 25, 2017 (CN) .......................... 2017 1 0612541
Jan. 7, 2018 (CN) ..................... 2018 2 0021470 U (51) Int. Cl.
*G02B 27/09* (2006.01)
*G06K 9/00* (2006.01)
*H01L 27/146* (2006.01)

(52) U.S. Cl.
CPC .... *G06K 9/00087* (2013.01); *H01L 27/14629* (2013.01); *G02B 2006/12107* (2013.01); *G02B 2006/12138* (2013.01)

(58) Field of Classification Search
CPC .. G06K 9/00053; G06K 9/00892; G06K 9/20; G06K 9/22; G06K 9/24; G06K 9/36; G06K 9/46; G06K 9/4604; G06K 9/00087; G02B 6/0031; G02B 27/0977; H01L 27/14629

See application file for complete search history.

IMAGE CAPTURE APPARATUS

CROSS REFERENCE TO RELATED APPLICATION

This application is a continuation-in-part application of and claims the priority benefit of a prior application Ser. No. 15/588,700, filed on May 8, 2017, now pending, which claims the priority benefits of U.S. provisional application Ser. No. 62/371,230, filed on Aug. 5, 2016, U.S. provisional application Ser. No. 62/413,974, filed on Oct. 27, 2016, and China application serial no. 201720260844.9, filed on Mar. 17, 2017. This application is also a continuation-in-part application of and claims the priority benefit of a prior application Ser. No. 15/399,704, filed on Jan. 5, 2017, now pending, which claims the priority benefits of U.S. provisional application Ser. No. 62/371,230, filed on Aug. 5, 2016, U.S. provisional application Ser. No. 62/413,974, filed on Oct. 27, 2016, and Taiwan application serial no. 105135846, filed on Nov. 4, 2016. This application is also a continuation-in-part application of and claims the priority benefit of a prior application Ser. No. 15/719,575, filed on Sep. 29, 2017, now pending, which claims the priority benefits of China application serial no. 201710612541.3, filed on Jul. 25, 2017 and Taiwan application serial no. 106121692, filed on Jun. 29, 2017. This application also claims U.S. 62/574,222 filed Oct. 19, 2017, and CN201820021470.X filed Jan. 7, 2018. The entirety of each of the above patent applications is hereby incorporated by reference herein and made a part of this specification.

BACKGROUND

1. Technical Field

The instant disclosure relates to a photoelectric device, in particular, to an image capture apparatus.

2. Description of Related Art

Existing optical biometric systems can be used to detect and recognize faces, voices, irises, retinas or fingerprints. Taking an optical fingerprint identification system as an example, an image capturing device in an optical fingerprint identification system generally includes a substrate, a light emitting device, a light transmitting element, a light guiding device, and an image sensor; in which, the light-emitting device and the image sensor are disposed on the substrate, the light guiding device is disposed on the light emitting device and the image sensor, and the light transmitting element is disposed on the light guiding device.

The light beam generated by the light emitting device is transmitted to the light transmitting element through the light guiding device, and the light beam is totally reflected by the interface of the light transmitting element and the environmental medium, then being received by the image sensor. There are a plurality of irregular ridge patterns and valley patterns on fingers, when a user places the finger on the light transmitting element, the ridges contact the light transmitting element, but the valleys do not. Therefore, the ridges which contact the light transmitting element will destroy the total reflection of the light beam in the light transmitting element whereas the valleys which do not contact the light transmitting element will not affect the total reflection of the light beam, so that the fingerprint captured by the image sensor has dark lines corresponding to the ridges and bright lines corresponding to the valleys. Subsequently, the fingerprint captured by the image sensor is processed by the image processing device to further determine the user identity.

Moreover, in existing image capturing devices, an optical adhesive is usually further used to fill up the gap between the light guide element and the substrate, as well as the gap between the light guide element and the image sensor.

However, due to the process constraints, the optical adhesive may have small bubbles or may not be completely cured. If the bubbles are contained in the optical adhesive between the light guide element and the image sensor, or the optical adhesive is not completely cured to produce voids, the light beam which is totally reflected by the light transmitting element will be re-reflected before entering the image sensor, so that the light beam will not be received by the image sensor. Thus, the fingerprint captured by the image sensor will not be completed, and impair the recognition.

SUMMARY

The technical problem to be solved by the present disclosure is to provide an image capture apparatus which solves the problem of the signal light beam being totally reflected again before entering the image capture device to reduce the recognition of the image capture apparatus.

An exemplary embodiment of the present disclosure provides an image capture apparatus, including a light guide element, an image capture device and a light emitting device. The light guide element has a first side and a second side, and a light emitting portion disposed on the second side, and the light emitting portion has a plurality of enhanced transmission microstructures. The image capture device is disposed on the second side of the light guide element corresponding to the position of the enhanced transmission microstructures. The light emitting device is used to generate a light beam which is transmitted in the light guide element; in which the light beam undergoes at least one total reflection in the light guide element to form a signal light beam passing through the enhanced transmission microstructures and then impinging on by the image capture device.

To sum up, the image capture apparatus of the present disclosure uses "the light emitting portion has a plurality of enhanced transmission microstructures" and "an image capture device disposed on the second side of the light guide element corresponding to the position of the enhanced transmission microstructures" to prevent the signal light beam from being totally reflected before entering the image capture device, so that the image recognition of the image capture apparatus is improved.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Reference will now be made in detail to the exemplary embodiments of the instant disclosure, examples of which are illustrated in the accompanying drawings. Wherever possible, the same reference numbers are used in the drawings and the description to refer to the same or like parts.

Figure 1:
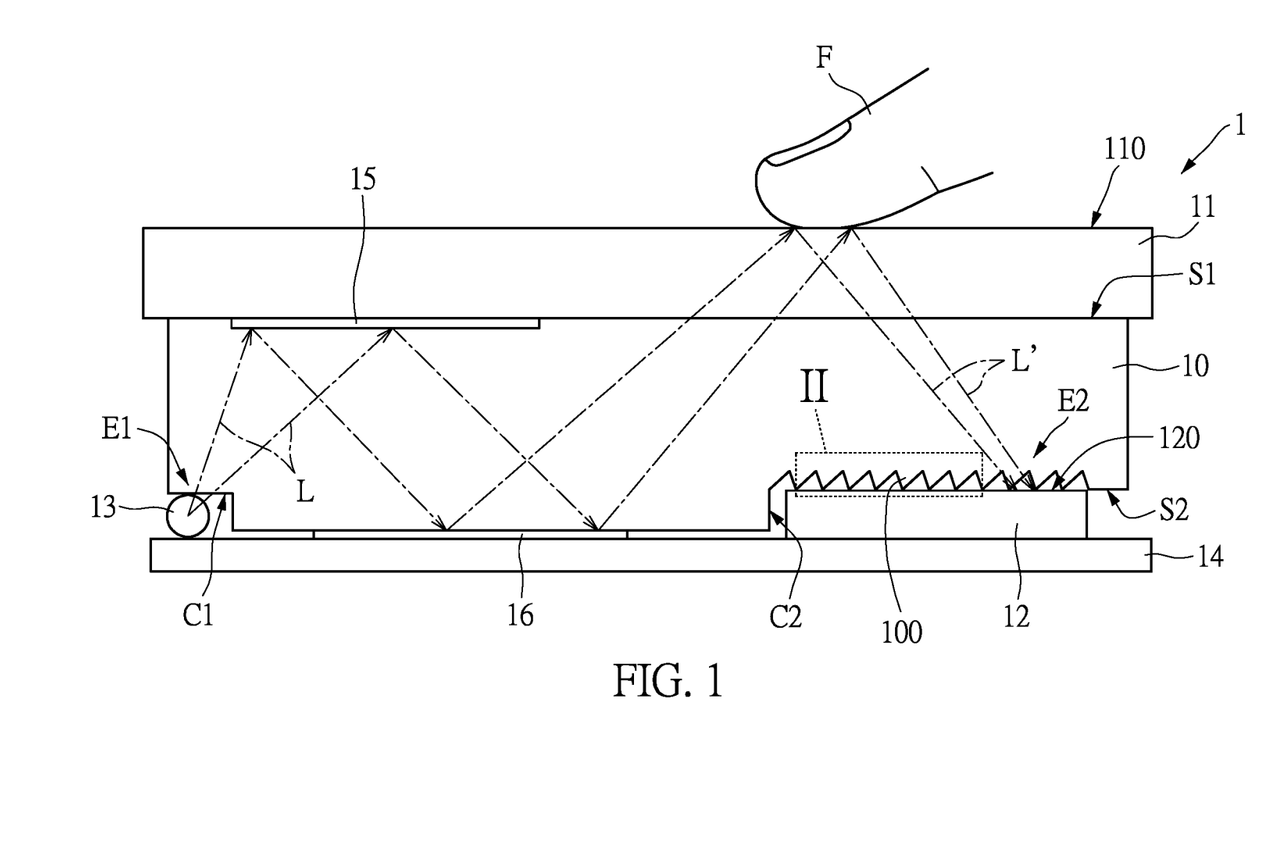
FIG. 1 is a cross-sectional view depicting one embodiment of the image capture apparatus of the present disclosure.
Figure 2:
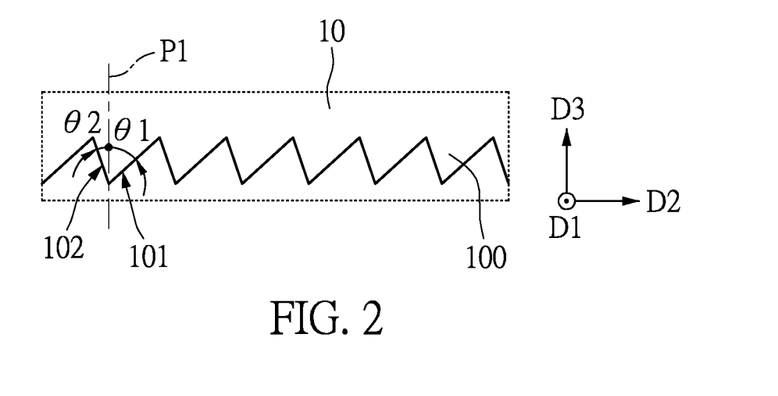
FIG. 2 is a partial enlarged view depicting area II of FIG. 1 of one embodiment of a plurality of enhanced transmission microstructures of the present disclosure.

Please refer to FIG. 1 and FIG. 2. FIG. 1 shows a cross-sectional view of one embodiment of the image capture apparatus of the present disclosure, and FIG. 2 is a partial enlarged view depicting area II of FIG. 1 of one embodiment of a plurality of enhanced transmission microstructures of the present disclosure.

An exemplary embodiment of the present disclosure provides an image capture apparatus 1. The image capture apparatus 1 is used in an environmental medium. In an embodiment, the above-mentioned environmental medium can be gas, water, or other kinds of environmental mediums. The image capture apparatus 1 can used to capture an image of an object F for identification, the above-mentioned object F can be a user's finger, palm, wrist or eyeball, and the image captured by the image capture apparatus 1 is, for example, a fingerprint, a palm print, a vein, a pupil, or an iris image. However, the present disclosure is not limited thereto.

As shown in FIG. 1, the image capture apparatus 1 according to an exemplary embodiment of the present disclosure includes a substrate 14, a light emitting device 13, a light guide element 10, a light transmitting element 11, and an image capture device 12.

The light guide element 10 is used to transmit the light beam. Therefore, the material of the light guide element 10 can be selected according to the light beam to be transmitted. In an embodiment, the material of the light guide element 10 can be, for example, glass, polymethymethacrylate (PMMA) or polycarbonate (PC) which can transmit visible lights. In another embodiment, when the light beam transmitted by the light guide element 10 is an infrared light or other invisible lights, the material of the light guide element 10 may also be selected according to actual needs. In an embodiment, the refractive index of the light guide element 10 may be greater than or equal to 1.4 and less than or equal to 1.6, but the present disclosure is not limited thereto.

In an exemplary embodiment, the light guide element 10 has a first side S1 and a second side S2 opposite to the first side S1. The light guide element 10 has a light incident portion E1 and a light emitting portion E2 which are located on the second side S2. The light beam L enters the light guide element 10 from the light incident portion E1, passes through the light guide element 10, and is totally reflected at least one time to form a signal light beam L', then the light beam L leaves the light guide element 10 through the light emitting portion E2 of the light guide element 10. In this exemplary embodiment, a plurality of enhanced transmission microstructures 100 are disposed on the light emitting portion E2 of the light guide element 10.

It should be noted that when the signal light beam L' enters the environmental medium (such as air or air bubbles) by the light guide element 10, in order to prevent the angle of the light beam projecting to the light emitting portion E2 from being greater than the total reflection critical angle of the light guide element 10 to cause that the signal light beam L' supposed to be emitted by the light emitting portion E2 will be totally reflected again, the light-emitting portion E2 is disposed with a plurality of enhanced transmission microstructures 100 to break the total reflection of the signal light beam L'.

Specifically, each enhanced transmission microstructure 100 has a light receiving area 101 and a back area 102. In an embodiment, the light receiving area 101 enables an incident angle of the signal light beam L' to be less than the total reflection critical angle of the light guide element 10, and the back area 102 enables an incident angle of the signal light beam L' to be greater than the total reflection critical angle. In another exemplary embodiment, the back area 102 is substantially parallel to the main projection direction of the signal light beam L', so that the signal light beam L' is less likely to be projected on the back area 102. In addition, the light receiving area 101 is substantially vertical to the main projection direction of the light beam L, and the light receiving area 101 is greater than back area 102, such that most of the signal light beam L' project to the light receiving area 101 and the signal light beam L' projecting to the light receiving area 101 would not to be totally reflected easily.

Please refer to FIG. 1 and FIG. 2. It should be noted that although a small amount of stray lights may be projected to the back area 102, the stray light will be totally reflected, and it will not emit out from the light emitting portion E2 and interfere with the signal of the image capture device 12 to cause ghosting. In addition, after the signal light beam L' passing through the light receiving area 101, a portion of the light beam will be transmitted through the light receiving surface 120 of the image capture device 12 and the back area 102, then the light beam will be refracted to be another light beam with a greater angle, and the light beam will be totally reflected on an outer surface 110 of the light transmitting element 11. Therefore, the angle of the totally reflected light beam is greater than the original one, resulting in that the light beam travels away from the original path and will not enter the light receiving surface 120 of the image capture device 12 again, so as to avoid the signal overlapping.

Referring to FIG. 2, in this embodiment, the enhanced transmission microstructures 100 are connected with each other, and the cross-sectional shape of each enhanced transmission microstructure 100 may be mountain-shaped, wave-shaped or zigzag-shaped. In the embodiment of FIG. 2, the cross-sectional shape of each enhanced transmission microstructure 100 is zigzag-shaped. In addition, both the light receiving area 101 and the back area 102 of the embodiment are inclined planes.

Figure 3:
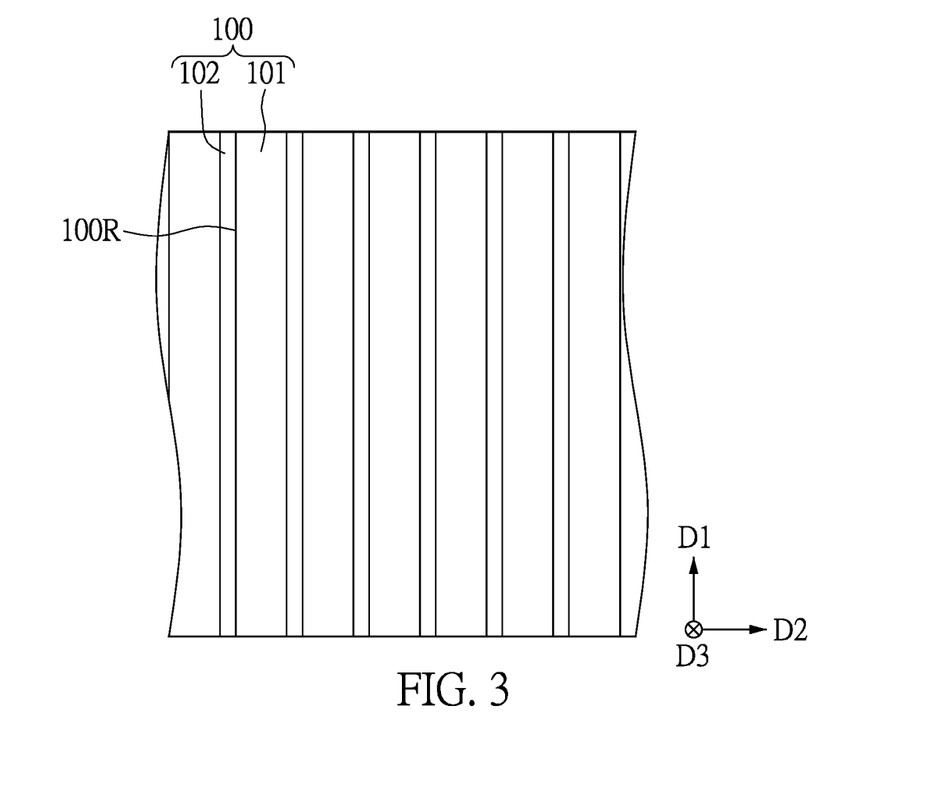
FIG. 3 is a partial bottom view depicting one embodiment of the light guide element of the present disclosure.

Please refer to FIG. 2 and FIG. 3 together. FIG. 3 shows a partial bottom view of the light guide element according to an embodiment of the present disclosure. Furthermore, in this embodiment, each enhanced transmission microstructure 100 is an asymmetric column, and the asymmetric column extends in the first direction D1 and is arranged along the second direction D2.

Each asymmetric column has a ridgeline 100R, that is, a borderline between the light receiving area 101 and the back area 102. In the present embodiment, a vertical reference plane P1 passing through the ridgeline 100R is defined. As shown in FIG. 2, the vertical reference plane P1 is parallel to the third direction D3, which is also parallel to the thickness direction of the light guide element 10. The light receiving area 101 and the back area 102 are respectively located at two opposite sides of the vertical reference plane P1. The light receiving area 101 and the vertical reference plane P1 form a first angle θ1, and the back area 102 and the vertical reference plane P1 form a second angle θ2. In this embodiment, the first angle θ1 is greater than the second angle θ2 to ensure that most of the light beam can be projected to the light receiving area 101 and it will no longer be totally reflected.

Additionally, in this embodiment, with regard to the two adjacent enhanced transmission microstructures 100, the edge of the light receiving area 101 of one enhanced transmission microstructure 100 may overlap the edge of the back area 102 of another enhanced transmission microstructure 100. That is to say, the two adjacent enhanced transmission microstructures 100 do not form a connection area to be connected, which further reduces the probability of total reflection of the light beams. However, in other embodiments, as long as the inclination angle of the connection area with respect to the vertical reference plane P1 can avoid the total reflection of the light beam or does not affect the path of the light beam, the connection area may be disposed between every two adjacent enhanced transmission microstructures 100.

In addition, the shape of the enhanced transmission microstructure 100 according to the embodiment of the present disclosure is not limited to an asymmetric column, and the light receiving area 101 and the back area 102 may also be a curved surface. For example, the curved surface can be a concave surface or a convex surface. Please refer to FIG. 4, which illustrates a partial bottom view of the light guide element according to another exemplary embodiment of the present disclosure. In this embodiment, multiple enhanced transmission microstructures 100 are arranged in an array, and each enhanced transmission microstructure 100 is an eccentric micro-lens.

Figure 4:
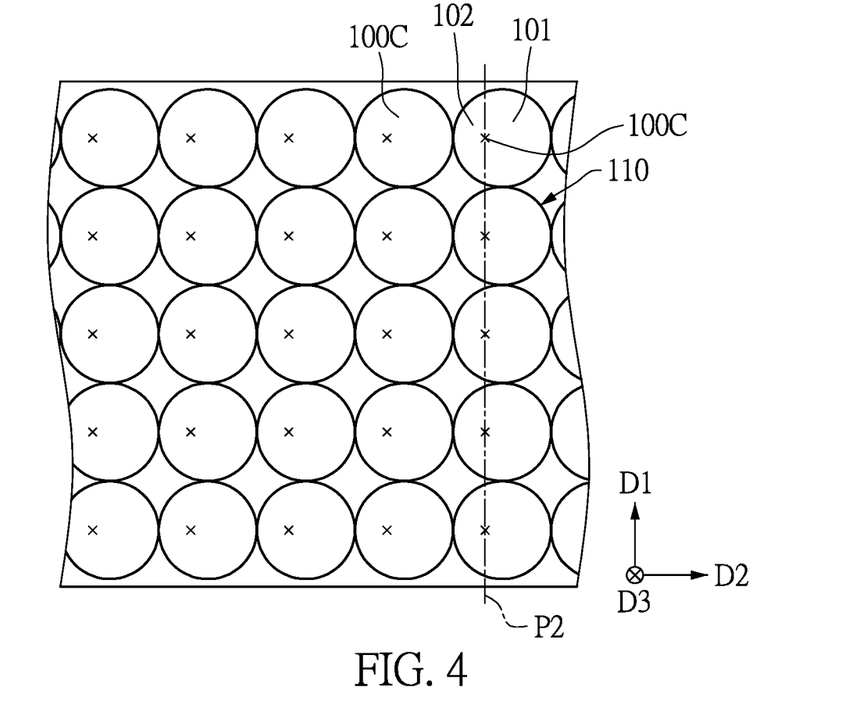
FIG. 4 is another partial bottom view depicting one embodiment of the light guide element of the present disclosure.

As shown in FIG. 4, the bottom cross-sectional shape of each enhanced transmission microstructure 100 is circular; however, in terms of the bottom perspective, the vertex 100C of the enhanced transmission microstructure 100 is offset with respect to the center of the bottom cross-sectional shape (circle). That is, the vertex 100C of the enhanced transmission microstructure 100 is not aligned with the center of the bottom cross-sectional shape (circle). In this embodiment, the edge of one enhanced transmission microstructure 100 is connected to the edge of another enhanced transmission microstructure 100.

Furthermore, in the embodiment, a line P2 is defined by the vertexes 100C of all enhanced transmission microstructures 100 arranged along the first direction D1 in the same row, and the line P2 can differentiate the surface area of each enhanced transmission microstructure 100 into a light receiving area 101 and a back area 102. Specifically, the light receiving area 101 is located at the right side surface area of the line P2, and the back area 102 is located at the left side surface area of the line P2. As shown in FIG. 4, the light receiving area 101 is greater than the back area 102.

Figure 5:
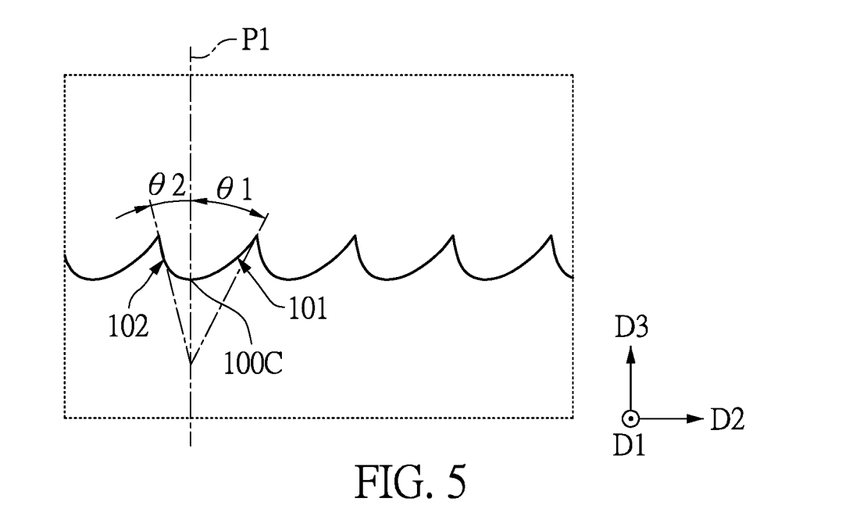
FIG. 5 is yet another partial bottom view depicting one embodiment of the light guide element of the present disclosure.

Please refer to FIG. 5, which shows a partial cross-sectional view of the light guide element according to yet another embodiment of the present disclosure. Specifically, FIG. 5 is a cross-sectional view depicting the plurality of enhanced transmission microstructures 100 in the second direction D2 as shown in FIG. 4. In this embodiment, the cross-sectional shape of the enhanced transmission microstructure 100 is substantially wavy or mountain-shaped. That is to say, both the light receiving area 101 and the back area 102 are curved surfaces.

In addition, any tangent plane to the light receiving area 101 at any point and a vertical reference plane P1 passing through the vertex 100C form a first angle θ1, any tangent plane to the back area 102 at any point and the vertical reference plane P1 passing through the vertex 100C form a second angle, and the first angle θ1 is greater than the second angle θ2. Accordingly, when the light beam is projected to the light receiving area 101, the incidence angle of the light beam is less than the total reflection critical angle of the light guide element 10 that can be ensured, so as to prevent the light beam from being totally reflected.

In other embodiments, the enhanced transmission microstructure 100 can be other eccentric cones, such as an eccentric polygonal cone (the bottom cross-sectional shapes of the enhanced transmission microstructures 100 are triangular), a quadrangular cone or other polygonal cones. The embodiment of the present disclosure does not limit the shape of the enhanced transmission microstructure 100, as long as the probability of the total reflection of the light beam can be reduced (or the probability of the light beam penetrating the light emitting portion E2 can be increased).

Please further refer to FIG. 1. The image capture apparatus 1 in this embodiment further includes a light transmitting element 11. The light transmitting element 11 is disposed on the first side S1 of the light guide element 10 and has an outer surface 110 which is in contact with the environmental medium and faces away from the light guide element 10. If the image capture apparatus 1 is used in an optical fingerprint recognition system for capturing fingerprints and/or veins, the outer surface 110 of the light transmitting element 11 can be touched or pressed by a finger for detection and recognition.

The material of the light transmitting element 11 can be the same as that of the light guide element 10 and has a refractive index similar to the refractive index of the light guide element 10. Accordingly, when the light beam is transmitted from the light guide element 10 to the light transmitting element 11, refraction can be avoided. In an embodiment, the material of the light transmitting element 11 may be selected from glass, polymethymethacrylate (PMMA) or polycarbonate (PC) or other suitable materials. In addition, the light transmitting element 11 may be disposed on the light guide element 10 with a suitable optical adhesive (not shown) or by other fixing methods. In the present disclosure, the light transmitting element 11 may be an OLED display panel or an OLED display panel with a touch layer. The structure of the light transmitting element 11 has been disclosed by the U.S. Patent Application No. 62/533,632, which is entitled as "BIO-SENSING APPARATUS AND SENSING METHOD THEREOF". It should be mentioned that the outer surface of the OLED display panel with the touch layer has a protective layer. Furthermore, as described herein, the display panel is not limited to a rigid panel or a flexible panel.

The image capture apparatus 1 further includes a substrate 14, a light emitting device 13, and an image capture device 12; in which, the light emitting device 13 and the image capture device 12 are both disposed on the substrate 14. The substrate 14 can be a circuit board on which wiring has been already configured in advance. In addition, the material of the substrate 14 is a light absorbing material.

The image capture device 12 is disposed on the substrate 14 corresponding to the plurality of enhanced transmission microstructures 100 of the light guide element 10 to capture the image of the object F. In other words, the light guide element 10 is located between the image capture device 12 and the light transmitting element 11.

The image capture device 12 has a light receiving surface 120 for receiving the light beam L emitted by the light emitting portion E2 of the light guide element 10. In other words, the light beam is projected to the light receiving surface 120 of the image capture device 12 after passing through the plurality of enhanced transmission microstructures 100. The image capturing device 12 is, for example, a CCD (Charge Coupled Device) or a CMOS (Complementary Metal-Oxide Semiconductor). However, in other embodiments, the image capture device 12 can be other image sensors.

The light-emitting portion 13 is disposed on the substrate 14 and close to the light incident portion E1 of the light guide element 10. In this embodiment, the light emitting device 13 is disposed outside the light guide element 10, and the light beam L generated by the light emitting device 13 is projected to the light incident portion E1 of the light guide element 10. The light beam L generated by the light emitting device 13 can be a visible light or an infrared light, the light emitting device 13 can be a light emitting diode or other suitable light emitting device, and the light beam includes a collimated or non-collimated light beam, but the present disclosure is not limited thereto.

Further, the second side S2 of the light guide element 10 has a first recessed portion C1 for accommodating the light emitting device 13 and a second recessed portion C2 for accommodating the image capture device 12. The light incident portion E1 of the light guide element 10 is located at the first recessed portion C1 and the light emitting portion E2 of the light guide element 10 is located at the second recessed portion C2.

As shown in FIG. 1, when the light emitting device 13, the light guide element 10, and the image capture device 12 are all disposed on the substrate 14, the light emitting device 13 can be fitted and fixed in the first recessed portion C1, and the image capture device 12 can be fitted and be fixed in the second recessed portion C2. In addition, in a feasible embodiment, the plurality of enhanced transmission microstructures 100 are located at the bottom of the second recessed portion C2. In this way, the overall volume of the image capture apparatus 1 can be shortened. However, in some embodiments, the first recessed portion C1 and the second recessed portion C2 can be omitted. In other embodiments, the light emitting device 13 may be embedded in the light guide element 10. Specifically, after the light emitting device 13 is disposed on the substrate 14, the light guide element 10 is formed by steps of potting and curing, such that the light emitting device 13 is embedded in the light guide element 10. Consequently, the light beam L generated by the light emitting device 13 can be directly transmitted through the light guide element 10 without relying on any other medium.

In addition, the light emitting device 13 in this embodiment of the present disclosure is disposed on the second side S2 of the light guide element 10. In other embodiments, the light emitting device 13 can be disposed on the first side S1 of the light guide element 10.

In addition, the image capture apparatus 1 according to the embodiment of the present disclosure further includes a first reflective element 15 and a second reflective element 16. The first reflective element 15 and the second reflective element 16 are respectively disposed on the first side S1 and the second side S2 of the light guide element 10. Specifically, the first reflective element 15 is located between the light transmitting element 11 and the light guide element 10, and the second reflective element 16 is located between the substrate 14 and the light guide element 10. In an embodiment, the first reflective element 15 and the second reflective element 16 can be reflective sheets or reflective films formed on the surface of the light guide element 10 or may be formed by gratings, but the present disclosure is not limited thereto.

In addition, in this embodiment, the first reflective element 15 and the second reflective element 16 may be staggered with respect to each other and at least partially overlap in the thickness direction of the light guide element 10 to guide the light beam L to the light transmitting element 11. In other embodiments, the first reflective element 15 and the second reflective element 16 may be completely staggered without overlapping. Therefore, the present disclosure does not limit the relative positions of the first reflective element 15 and the second reflective element 16 or the reflection of the light beam L, as long as the light beam L can be guided to the light transmitting element 11.

For example, in other exemplary embodiments, light beam L can undergo a total reflection in the light guide element 10 and the environmental medium by designing the traveling path of light beam L. In this case, the second reflective element 16 may be omitted.

In general, the light beam L generated by the light emitting device 13 enters the light guide element 10 through the light incident portion E1, is sequentially reflected by the first reflective element 15 and the second reflective element 16 to be transmitted in the light transmitting element 11 of the light guide element 10, and then causes total reflection at the interface of the light transmitting element 11 and the environmental medium, which is the outer surface 110 of the light transmitting element 11.

When the object F (e.g. a finger) contacts the outer surface 110 of the light transmitting element 11, the ridges of the finger contact the outer surface 110, such that a portion of the light beam L cannot be totally reflected, and the image capture device 12 obtains the dark lines corresponding to the ridges of the finger. On the other hand, the valleys of the finger do not touch the outer surface 110 of the light transmitting element 11, and the other portion of the light beam L can still be totally reflected to form a signal light beam L'. The signal light beam L' is projected toward the light emitting portion E2 of the light guide element 10 and directed to the light receiving surface 120 of the image capture device 12 by the plurality of enhanced transmission microstructures 100 of the light guide element 10. Subsequently, the light beam L' received by the image capture device 12 is performed an image process by an image processing component to obtain the fingerprint image of the object F. This is to say, in the embodiment of the present disclosure, the enhanced transmission microstructures 100 disposed on the light emitting portion E2 of the light guide element 10, can be applied to prevent the signal light beam L' from being totally reflected again before entering the image capture device 12, so as to reduce the image resolution of the image capture apparatus 1.

Figure 6:
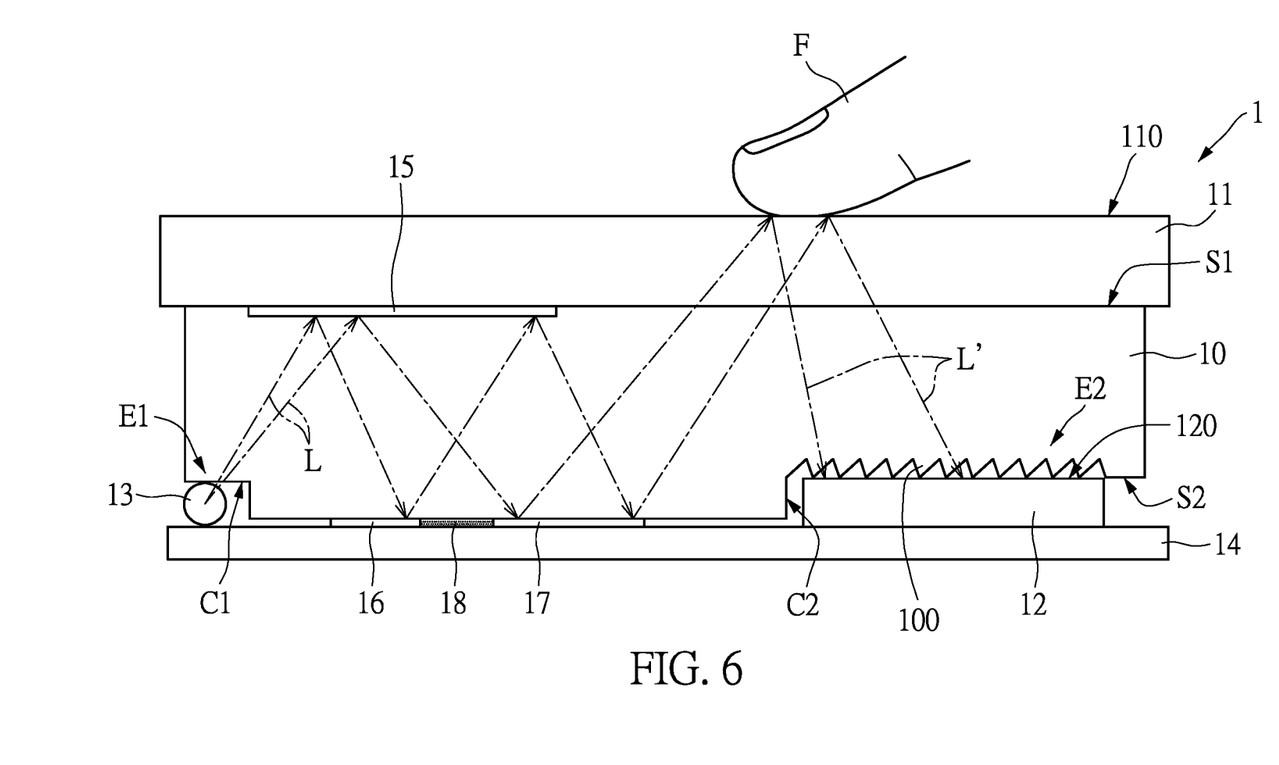
FIG. 6 is another sectional view depicting one embodiment of the image capture apparatus of the present disclosure.

Please refer to FIG. 6. FIG. 6 is a schematic cross-sectional view of an image capture apparatus according to another embodiment of the present disclosure. The image capture apparatus 1 of FIG. 6 is the same as the image capture apparatus of FIG. 1 or is denoted with the same component symbols corresponding to FIG. 1, and thus unnecessary details are not repeated.

In the embodiment of FIG. 6, the image capture apparatus 1 further includes a third reflective element 17 located on the second side S2 of the light guide element 10. That is to say, the second reflective element 16 and the third reflective element 17 are located on the same side of the light guide element 10, but are mutually separated to be arranged. In this embodiment, the light beam L is reflected by the first reflective element 15, the second reflective element 16 and the third reflective element 17 to be transmitted in the light guide element 10 and projected to the light transmitting element 11.

In an embodiment, the first reflective element 15 and the second reflective element 16 are completely overlapped in the thickness direction of the light guide element 10, and the first reflective element 15 and the third reflective element 17 only partially overlap in the thickness direction of the light guide element 10.

Moreover, the image capture apparatus 1 in this embodiment further includes a light absorbing element 18 disposed between the second reflective element 16 and the third reflective element 17. In the present embodiment, the light absorbing element 18 and the first reflective element 15 overlap in the thickness direction of the light guide element 10. Further, the vertical projection of the first reflective element 15 may at least partially overlap the light absorbing element 18.

In other exemplary embodiments, the light absorbing element 18 may be disposed on other areas of the light guide element 10, that is, the area where the first reflective element 15, the second reflective element 16, and the third reflective element 17 are not disposed. For example, the image capture apparatus 1 further includes a plurality of light absorbing assemblies 18 disposed on two opposite sidewalls of the light guide element 10, and the aforementioned sidewall surface refers to the surface connected between the first side S1 and the second side S2 of the light guide element 10. The light absorbing element 18 can be an opaque and not reflective masking layer, for example, an ink layer, an adhesive layer, or a masking sheet, but the foregoing embodiments are not intended to limit the present disclosure.

The light absorbing element 18 can absorb and reduce the stray light which does not follow the predetermined light path, so that the image capture device 12 can be prevented from receiving stray light other than the signal light beam L'. In addition, the light absorbing element 18 can be configured to increase the image capturing area and make the signal light beam L' transmit to the image capture device 12 uniformly, further improving imaging quality.

Figure 7:
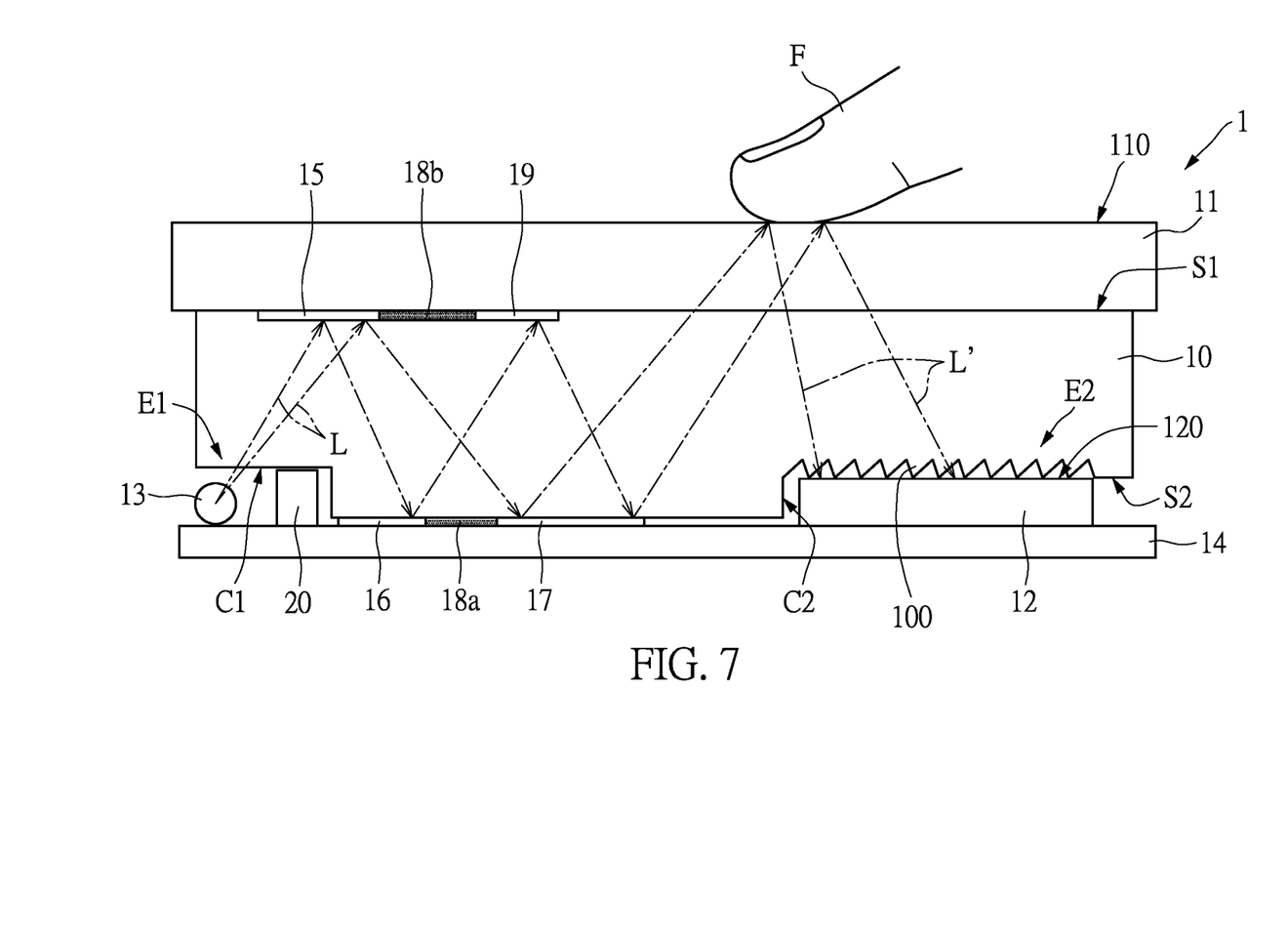
FIG. 7 is another cross-sectional view depicting one embodiment of the image capture apparatus of the present disclosure.

Please refer to FIG. 7, which is a cross-sectional view depicting an image capture device according to another exemplary embodiment of the present disclosure. The image capture apparatus 1 of FIG. 7 is the same as the image capture apparatus of FIG. 6 or is denoted with the same component symbols corresponding to FIG. 6, and thus unnecessary details are not repeated.

In the embodiment of FIG. 7, the image capture apparatus 1 further includes a fourth reflective element 19 located on the first side S1 of the light guide element 10. That is, the first reflective element 15 and the fourth reflective element 19 are located on the same side of the light guide element 10, but are mutually separated to be arranged. In this embodiment, the light beam L is sequentially reflected by the first reflective element 15, the second reflective element 16, the fourth reflective element 19 and the third reflective element 17 to be transmitted in the light guide element 10 and projected to the light transmitting element 11.

In an embodiment, the first reflective element 15 and the second reflective element 16 at least partially overlap in the thickness direction of the light guide element 10, and the fourth reflective element 19 and the third reflective element 17 also partially overlap in the thickness direction of the light guide element 10. However, the first reflective element 15 and the third reflective element 17 do not overlap in the thickness direction of the light guide element 10.

Moreover, in addition to the light absorbing element 18a disposed between the second reflective element 16 and the third reflective element 17, the image capture apparatus 1 further includes a light absorbing element 18b disposed between the first reflective element 15 and the third reflective element 17. In the present embodiment, the two light absorbing assemblies (18a and 18b) and the first reflective element 15 at least partially overlap in the thickness direction of the light guide element 10. It should be mentioned that the first reflective element 15, the second reflective element 16, the third reflective element 17 or the fourth reflective element 18 in any of the embodiments of the present disclosure may be formed alternatively by gratings, the mentioned gratings are formed by a plurality of mutually parallel striped surfaces arranged in an oblique manner (not shown in the figures). In addition, the reflectivity of the first reflective element may be the same as or different from that of the striped surface of the second reflective element, and the reflectivity of the third reflective element may be the same as or different from that of the striped surface of the fourth reflective element, which helps the light beam to be reflected by these gratings so as to enter the light guide element 10 and to be transmitted therein.

Similar to the embodiment of FIG. 6, the two light absorbing assemblies 18a, 18b can absorb and reduce stray light which does not follow the predetermined light path, thereby preventing the image capture device 12 from receiving stray light other than the signal light beam L'. In addition, the light absorbing element 18 can be configured to increase the image capturing area and make the signal light beam L' transmit to the image capture device 12 more uniformly, thereby improving imaging quality.

Moreover, in this embodiment, the image capture apparatus 1 further includes a block 20 disposed in the first recessed portion C1, and the block 20 is disposed between the light emitting device 13 and the image capture device 12 to prevent the light beam from being directly received by the image capture device 12. Additionally, the block 20 can limit the divergence angle of the light beam L generated by the light emitting device 13, so that the light beam L can be controlled to enter the light guide element 10 with a predetermined incident angle more accurately. In this way, the light path of the light beam L can be further controlled precisely, and most of the light beams L can be projected toward the object F, so as to improve the imaging quality of the image capture device 12.

Figure 8:
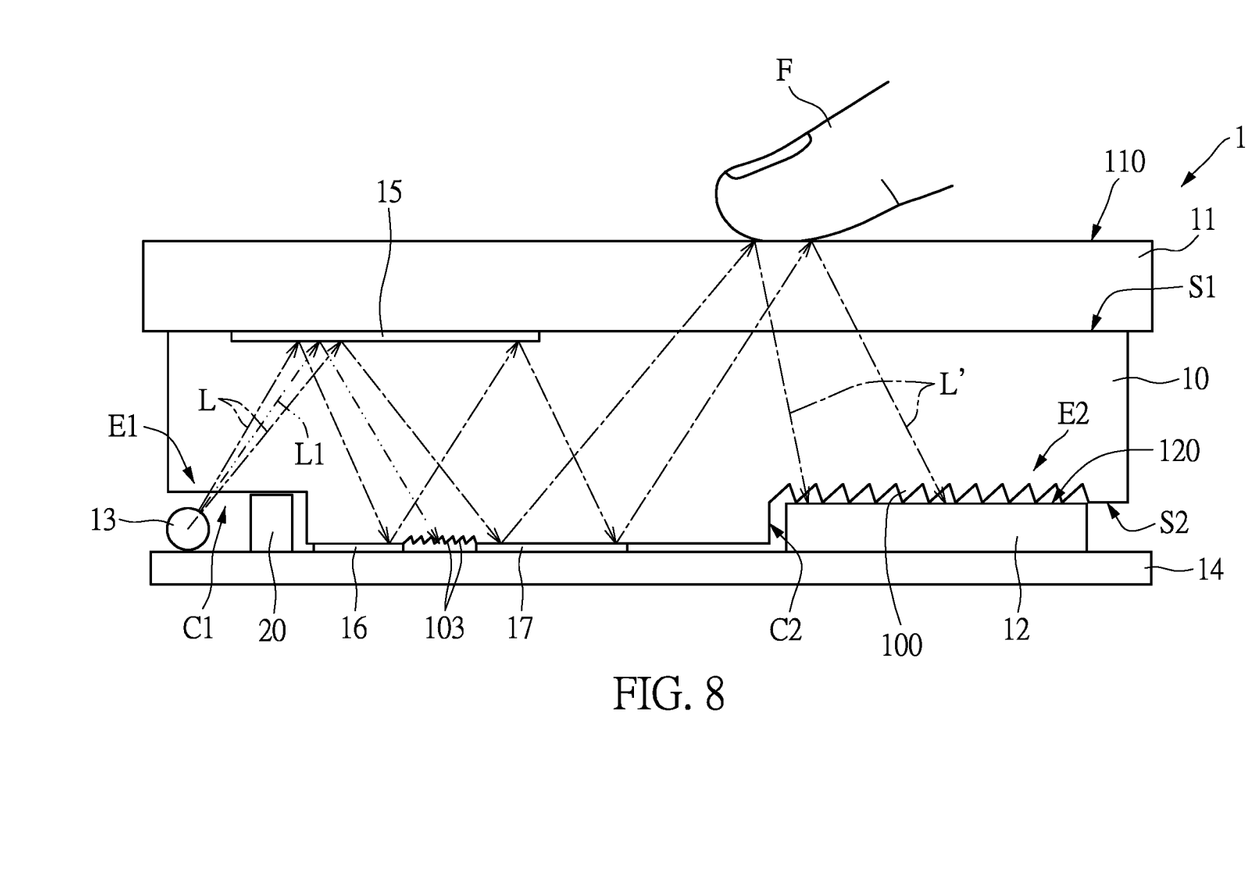
FIG. 8 is yet another cross-sectional view depicting one embodiment of the image capture apparatus of the present disclosure.

Please refer to FIG. 8, which is a schematic cross-sectional view of an image capture apparatus according to yet another embodiment of the present disclosure. The image capture apparatus 1 of FIG. 8 is the same as the image capture apparatus of FIG. 6 or is denoted with the same component symbols corresponding to FIG. 6, and thus necessary details are not repeated.

In the embodiment of FIG. 8, the light guide element 10 includes a plurality of optical microstructures 103 disposed between the second reflective element 16 and the third reflective element 17. In the present embodiment, the distributed location of the plurality of optical microstructures 103 and the first reflective element 15 at least partially overlap in the thickness direction of the light guide element 10. Further, the vertical projection of the first reflective element 15 can at least partially overlap the distributed location of the plurality of optical microstructures 103.

The shape of each optical microstructure 103 can be the same as that of the enhanced transmission microstructure 100 described above. For example, the cross-sectional shape of the optical microstructure 103 may also be zigzag-shaped, wavy-shaped or mountain-shaped, but the present disclosure is not limited thereto.

The plurality of optical microstructures 103 may project a portion of the light beam reflected by the first reflective element 15 to pass through the plurality of optical microstructures 103 and then to emit out from the light guide element 10. Further, the stray light L1 which does not follow a predetermined path can be emitted out from the light guide element 10 through the optical microstructures 103 and absorbed by the substrate 14, so as to prevent the image capture device 12 from receiving Astigmatism L1 other than the signal light beam L'. In addition, the configuration of the optical microstructures 103 can increase the imaging area and make the signal light beam L' transmit to the image capture device 12 more uniformly, which is beneficial for improving the imaging quality.

In addition, like the embodiment of FIG. 7, the image capturing apparatus 1 in the embodiment of FIG. 8 further includes a block 20 disposed in the first recessed portion C1. The block is applied to prevent the light beam L from directly projecting to the image capture device 12, and can limit the divergence angle of the light beam L generated by the light emitting device 13, so that the light beam L can be controlled to enter the light guide element 10 with a predetermined incident angle more accurately.

Figure 9:
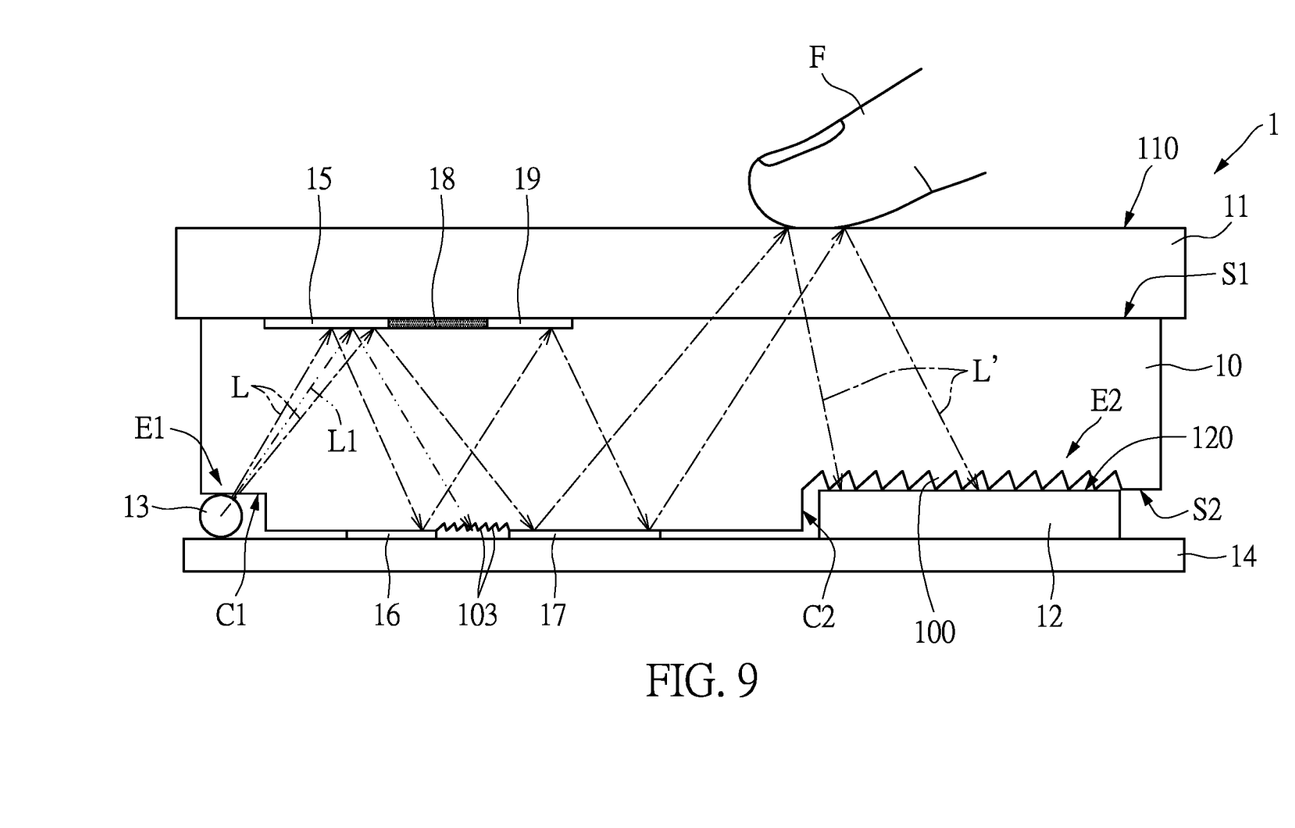
FIG. 9 is another cross-sectional view depicting one embodiment of the image capture apparatus of the present disclosure.

Please refer to FIG. 9. FIG. 9 is a cross-sectional view depicting an image capture apparatus according to another embodiment of the present disclosure. The image capture apparatus 1 of FIG. 9 is the same as the image capture apparatus of FIG. 7 or is denoted with the same component symbols corresponding to FIG. 7, and thus necessary details are not repeated.

In the embodiment of FIG. 9, the image capture apparatus 1 includes the light absorbing element 18 disposed on the first reflective element 15 and the fourth reflective element 19, and the light guide apparatus 10 includes a plurality of optical microstructures 103 disposed between the second reflective element 16 and the third reflective element 17. It should be mentioned that the first reflective element, the second reflective element, the third reflective element or the fourth reflective element of the present disclosure may be formed alternatively by gratings, the mentioned gratings are formed by a plurality of mutually parallel striped surfaces arranged in an oblique manner (not shown in the figures). In addition, the reflectivity of the first reflective element may be the same as or different from that of the striped surface of the second reflective element, and the reflectivity of the third reflective element may be the same as or different from that of the striped surface of the fourth reflective element, which helps the light beam to be reflected by these gratings so as to enter the light guide element 10 and to be transmitted therein.

In this embodiment, the distributed location of the plurality of optical microstructures 103 does not overlap with the first reflective element 15 and the fourth reflective element 19 in the thickness direction of the light guide element 10. In addition, the light absorbing element 18 and the second reflective element 16 at least partially overlap in the thickness direction of the light guide element 10, but the light absorbing element 18 and the third reflective element do not overlap in the thickness direction of the light guide element 10.

The light absorbing element 18 and the optical microstructures 103 of the present embodiment can allow the stray light L1 that does not follow along a predetermined path emitting out from the light guide element 10 and being absorbed by the substrate 14 or directly absorbed by the light absorbing element 18, so as to avoid the image capture device 12 receiving stray light from the signal light beam L'. In addition, the light absorbing element 18 and the optical microstructures 103 can be configured to increase the image capturing area and make the signal light beam L' transmit to the image capture device 12 more uniformly, thereby improving imaging quality.

Figure 10:
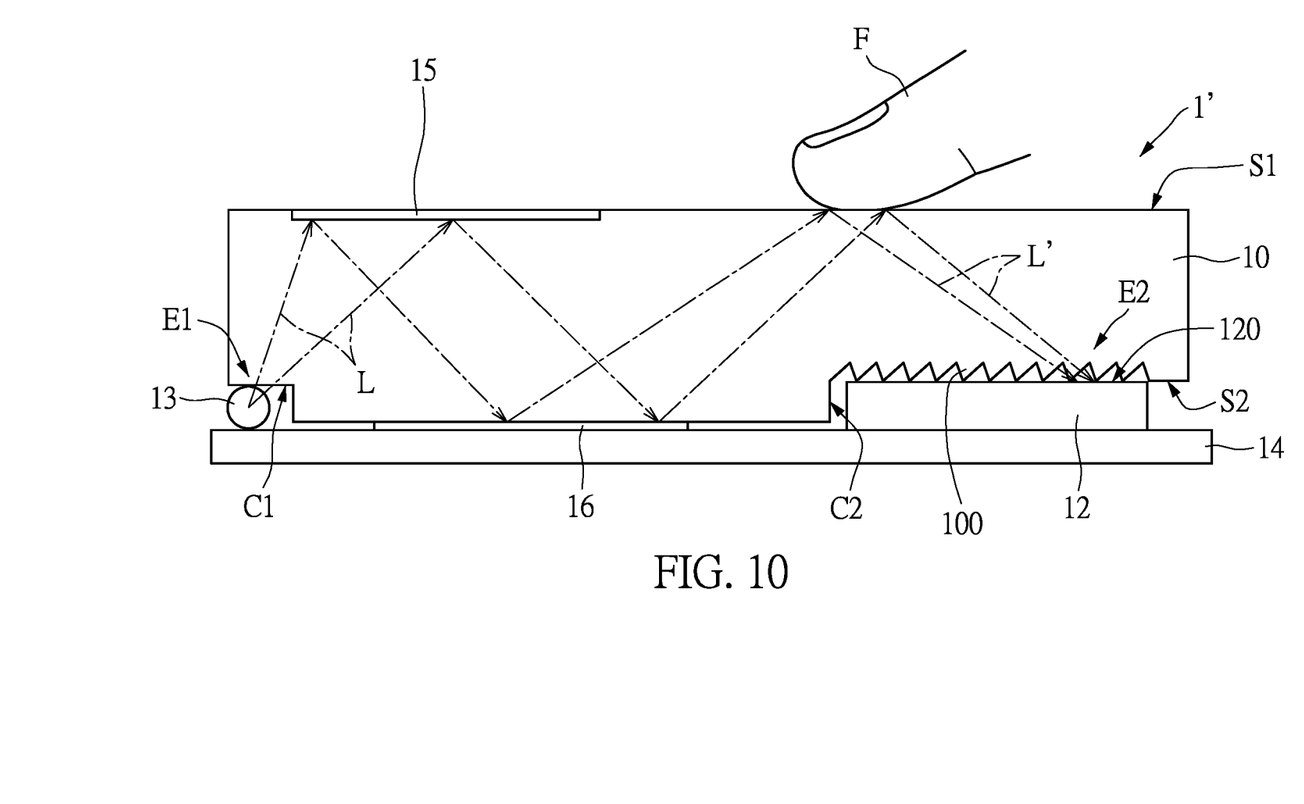
FIG. 10 is another cross-sectional view depicting one embodiment of the image capture apparatus of the present disclosure.

Please refer to FIG. 10. FIG. 10 is a cross-sectional view of an image capture apparatus according to another embodiment of the present disclosure. The image capture apparatus 1 of FIG. 10 is the same as the image capture apparatus of FIG. 1 or is denoted with the same component symbols corresponding to FIG. 1, and thus unnecessary details are not repeated.

In this embodiment, the image capture apparatus 1' does not include the light transmitting element 11 as shown in FIG. 1. Accordingly, after the light beam L generated by the light emitting device 13 enters of the light guide element 10 through the light incident portion E1, the light beam L is sequentially reflected by the first reflective element 15 and the second reflective element 16, then transmitting in the light guide element 10, and then causing total reflection at the interface of the light guide element 10 and the environmental medium, which is the surface of the first side S1 of the light guide element 10.

In other words, the surface located on the first side S1 of the light guide element 10 may be served as a contact surface to be contacted by the object F. When the object F (e.g. a finger) contacts the light guide element 10 by the first side S1 of the light guide element 10, the ridges of the finger make the light beam L not to be totally reflected, and the image capture device 12 obtains the dark lines corresponding to the ridges of the finger. On the other hand, the valleys of the finger do not touch the first side S1 of the light guide element 10, and the other portion of the light beam L can still be totally reflected to form a signal light beam L'. The signal light beam L' is projected toward the light emitting portion E2 of the light guide element 10 and directed to the light receiving surface 120 of the image capture device 12 by the plurality of enhanced transmission microstructures 100 of the light guide element 10. Subsequently, the light beam L' received by the image capture device 12 is performed an image process by an image processing component to obtain the fingerprint image of the object F for identification.

Figure 11:
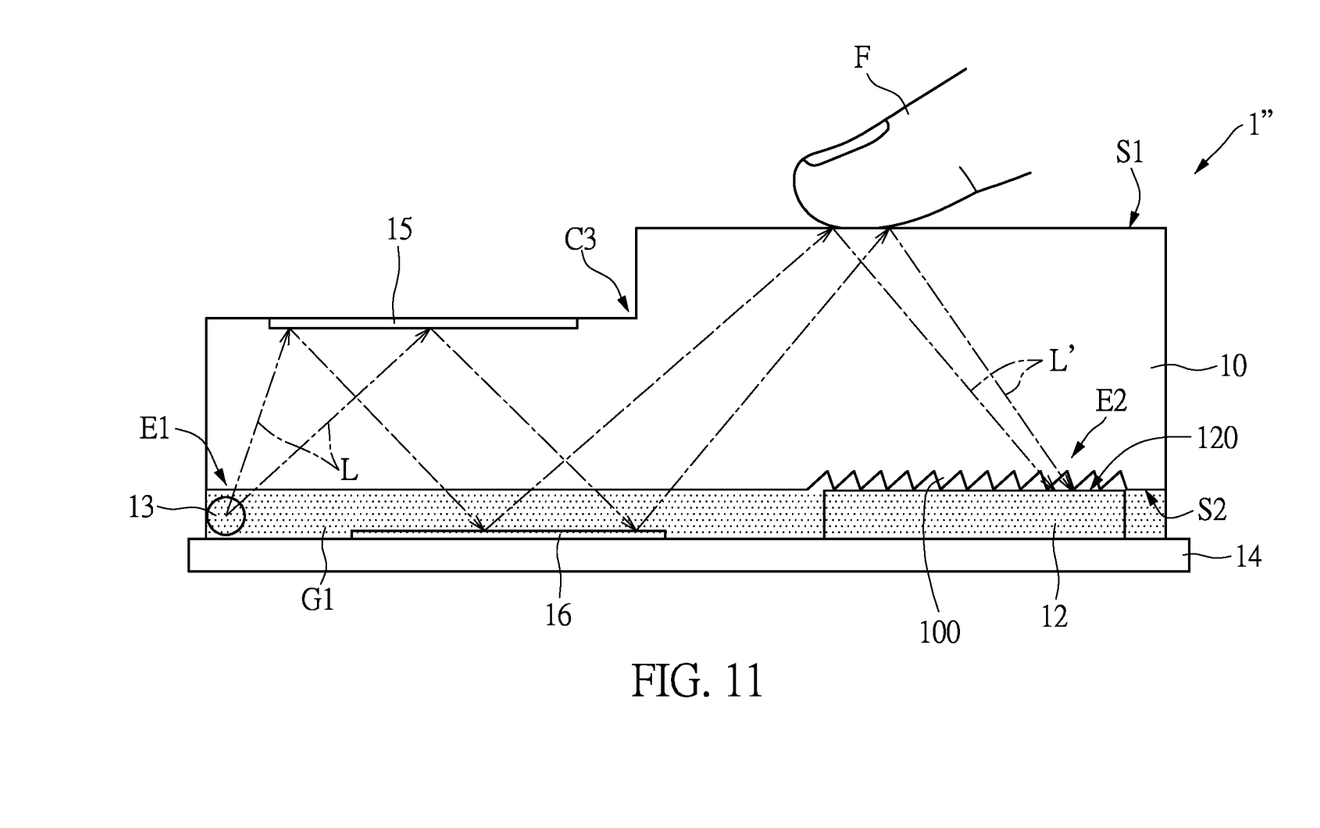
FIG. 11 is the other cross-sectional view depicting one embodiment of the image capture apparatus of the present disclosure.

FIG. 11 is a cross-sectional view of an image capture apparatus according to another embodiment of the present disclosure. The image capture apparatus 1" of this embodiment is the same as the image capture apparatus 1' of FIG. 10 or is denoted with the same component symbols corresponding to FIG. 10, and thus necessary details are not repeated.

In the present embodiment, the second side S2 of the light guide element 10 does not have the first recessed portion C1 and the second recessed portion C2. That is to say, the surface of the light guide element 10 on the second side S2 is a flat surface, but the plurality of enhanced transmission microstructures 100 are disposed on the light emitting portion E2 on the second side S2.

In addition, the image capture apparatus 1" in this embodiment further includes an optical adhesive G1. The optical adhesive G1 is located between the light guide element 10 and the substrate 14 to fix the light guide element 10 on the substrate 14, and the light emitting device 13 and the image capture device 12 are embedded in the optical adhesive G1. Further, the refractive index of the optical adhesive G1 may be substantially the same as that of the light guide element 10, for example, may be greater than or equal to 1.4 and less than or equal to 1.6. Therefore, when the light beam L enters the optical adhesive G1 by the light guide element 10, or enters the light guide element 10 by the optical adhesive G1, the light beam L will follow the predetermined optical path without generating refraction.

It should be noted that the optical adhesive G1 does not fill the gap between the image capture device 12 and the light emitting portion E2 (the plurality of enhanced transmission microstructures 100). Therefore, the plurality of enhanced transmission microstructures 100 disposed on the light emitting portion E2 can significantly reduce the probability of the signal light beam L' being totally reflected again at the light emitting portion E2, so as to improve the imaging quality of the image capture device 12.

In addition, in the present embodiment, another recessed portion C3 is disposed on the surface of the first side S1 of the light guide element 10, and the position of the recessed portion C3 corresponds to the position of the first reflective element 15 so as to reduce a portion of the thickness of the light guide element 10, thus providing a thinner image capture apparatus for various products.

In summary, the image capture apparatus 1 of the present disclosure uses "the light emitting portion E2 has a plurality of enhanced transmission microstructures 100" and "an image capture device 12 disposed on the second side of the light guide element 10 corresponding to the position of the enhanced transmission microstructures 100" to prevent the signal light beam from being totally reflected before entering the image capture device, so that, the image recognition of the image capture apparatus is improved. Furthermore, in the image capture apparatus 1 of the embodiment of the present disclosure, due to the plurality of enhanced transmission microstructures 100 disposed on the light emitting portion E2 of the light guide device 10, the signal light beam L' can be prevented from being totally reflected again and an optical adhesive is unnecessary to be filled between the substrate 14 and the light guide device 10. Therefore, in addition to g resolving the problem of light beam scattering caused by microbubbles in the optical adhesive or incomplete curing, the cost can be further reduced.

For an embodiment (e.g. image capture apparatus 1) in which an optical adhesive G1 is required to be applied between the light guide device 10 and the substrate 14, even if the image capture device 12 and the light exiting portion E2 are not filled with an optical adhesive G1, the probability of the signal light beam L' being totally reflected again in the light exiting portion E2 can be greatly reduced by the plurality of enhanced transmission structures 100 disposed in the light exit portion E2, so that the image capturing quality of the image capture device 12 can be improved.

In addition, by providing at least one of the light absorbing assembly 18 or the optical microstructure 103 on the first side S1 or the second side S2 of the light guide device 10, the stray light L1 received by the image capturing device 12 can be reduced and the image capturing area can be increased, which makes the signal light beam L' transmit to the image capture device 12 more uniformly, that is beneficial for improving the imaging quality of the image capture apparatus 1.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. An image capture apparatus, comprising:
a light guide element having a first side and a second side, wherein the light guide element has a light emitting portion disposed on the second side, and the light emitting portion has a plurality of enhanced transmission microstructures;
an image capture device disposed on the second side of the light guide element corresponding to the position of the enhanced transmission microstructures; and
a light emitting device for generating a light beam which is transmitted in the light guide element;
wherein the light beam undergoes at least one total reflection in the light guide element to form a signal light beam passing through the enhanced transmission microstructure and then received by the image capture device,
wherein the light guide element has a total reflection critical angle, and each enhanced transmission microstructure includes a light receiving area enabling an incident angle of the signal light beam to be less than the total reflection critical angle, and a back area enabling an incident angle of the signal light beam to be greater than the total reflection critical angle, and the light receiving area is greater than back area.

2. The image capture apparatus according to claim 1, further comprising: a light transmitting element disposed on the first side of the light guide element, wherein the light beam are transmitted by the light guide element and the light transmitting element, and then totally reflected by an outer surface of the light transmitting element to form the signal light beam.

3. The image capture apparatus according to claim 1, wherein each of the enhanced transmission microstructures is an asymmetrical pillar having a ridgeline, the light receiving area and a vertical reference plane passing through the ridgeline form a first angle, and the back area and the vertical reference plane form a second angle, and the first angle is greater than the second angle.

4. The image capture apparatus according to claim 3, wherein the light receiving area and the back area are respectively located at two opposite sides of the vertical reference plane.

5. The image capture apparatus according to claim 1, wherein a plurality of the enhanced transmission microstructures are arranged in an array, each of the enhanced transmission microstructures is an eccentric micro-lens having a vertex, any tangent plane to the light receiving area at any point and a vertical reference plane passing through the vertex form a first angle, any tangent plane to the back area at any point and the vertical reference plane passing through the vertex form a second angle, and the first angle is greater than the second angle.

6. The image capture apparatus according to claim 1, wherein the light receiving area of each of the enhanced transmission microstructures is an inclined plane or a curved surface, and the back area of each of the enhanced transmission microstructures is an inclined plane or a curved surface.

7. The image capture apparatus according to claim 1, comprising: a first reflective element disposed on the first side and a second reflective element disposed on the second side; wherein, the light beam is sequentially reflected by the first reflective element and the second reflective element to be transmitted in the light guide element.

8. The image capture apparatus according to claim 7, wherein the first reflective element and the second reflective element at least partially overlap in a thickness direction of the light guide element.

9. The image capture apparatus according to claim 8, further comprising: a third reflective element disposed on the second side and spaced apart from the second reflective element, wherein the light beam is reflected by the first reflective element, the second reflective element, and the third reflective element to be transmitted in the light guide element.

10. The image capture apparatus according to claim 9, further comprising: a light absorbing element disposed on the second side and between the second reflective element and the third reflective element, wherein the first reflective element and the second reflective element at least partially overlap in a thickness direction of the light guide element.

11. The image capture apparatus according to claim 10, further comprising: a fourth reflective element disposed on the first side and spaced apart from the first reflective element; the light beam is sequentially reflected by first reflective element, the second reflective element, the third reflective element, and the fourth reflective element to be transmitted in the light guide element.

12. The image capture apparatus according to claim 11, further comprising: another light absorbing element disposed between the first reflective element and the fourth reflective element, wherein two light absorbing elements at least partially overlap in a thickness direction of the light guide element.

13. The image capture apparatus according to claim 9, wherein the light guide element further includes a plurality of optical microstructures disposed between the second reflective element and the third reflective element, such that a portion of the light beam reflected by the first reflective element passes through the optical microstructures and then emits out from the light guide element.

14. The image capture apparatus according to claim 13, further comprising: a fourth reflective element disposed on the first side and spaced apart from the first reflective element, wherein the light beam is sequentially reflected by first reflective element, the second reflective element, the third reflective element, and the fourth reflective element to be transmitted in the light guide element.

15. The image capture apparatus according to claim 14, further comprising: a light absorbing element disposed between the first reflective element and the fourth reflective element, wherein the light absorbing element and a distribution area of the optical microstructures at least partially overlap in a thickness direction of the light guide element.

16. The image capture apparatus according to claim 14, wherein each of the first reflective element, the second reflective element, the third reflective element, and the fourth reflective element includes optical gratings.

17. The image capture apparatus according to claim 1, further comprising: a substrate, wherein the light emitting device, the light guide element, and the image capture device are disposed on the substrate, the light guide element has a first recessed portion for receiving the light emitting device, and a second recessed portion which is located at the second side for respectively accommodating the image capture device, and the plurality of enhanced transmission microstructures are located on a surface of the second recessed portion.

18. The image capture apparatus according to claim 17, further comprising: a block disposed in the first recessed portion, wherein the block is disposed between the light emitting device and the image capture device to prevent the light beam from being directly received by the image capture device.

19. The image capture apparatus according to claim 1, further comprising:
a substrate, wherein the light emitting device, the light guide element, and the image capture device are disposed on the substrate; and
an optical adhesive connected between the substrate and the light guide element so as to fix the light guide element on the substrate, wherein the light emitting device and the image capture device are embedded in the optical adhesive, and a gap is defined between the light emitting portion and the image capture device.

* * * * *